United States Patent
Namkung et al.

(10) Patent No.: US 10,285,278 B2
(45) Date of Patent: May 7, 2019

(54) DISPLAY APPARATUS HAVING PROTECTIVE LAYER ON THE PAD UNIT AND METHOD OF FABRICATING THE SAME

(71) Applicant: SAMSUNG DISPLAY CO., LTD., Yongin, Gyeonggi-Do (KR)

(72) Inventors: Jun Namkung, Yongin (KR); Soon-Ryong Park, Yongin (KR); Ju-Yeop Seong, Yongin (KR); Jung-Ho So, Yongin (KR); Eun-Yong Jeon, Yongin (KR); Seok-Gi Baek, Yongin (KR); Kwang-Hyeok Kim, Yongin (KR); Chul-Woo Jeong, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 490 days.

(21) Appl. No.: 14/320,956

(22) Filed: Jul. 1, 2014

(65) Prior Publication Data
US 2015/0077953 A1 Mar. 19, 2015

(30) Foreign Application Priority Data
Sep. 13, 2013 (KR) .......................... 10-2013-0110618

(51) Int. Cl.
*H05K 3/28* (2006.01)
*H05K 3/36* (2006.01)

(52) U.S. Cl.
CPC .............. *H05K 3/28* (2013.01); *H05K 3/361* (2013.01); *H05K 2201/0175* (2013.01); *H05K 2201/10128* (2013.01)

(58) Field of Classification Search
None
See application file for complete search history.

(56) References Cited

U.S. PATENT DOCUMENTS

| 6,600,529 B1 * | 7/2003 | Kusumoto ........... G02B 27/286 349/96 |
| 6,872,473 B2 | 3/2005 | Song et al. |
| 8,229,522 B2 | 7/2012 | Kim et al. |
| 2004/0245924 A1 | 12/2004 | Utsunomiya et al. |

(Continued)

FOREIGN PATENT DOCUMENTS

| CN | 1399502 A | 2/2003 |
| CN | 1575049 A | 2/2005 |

(Continued)

OTHER PUBLICATIONS

Cambridge University Engineering Department, Materials Data Book, 2003 Edition, pp. 11 and 15-19. http://www-mdp.eng.cam.ac.uk/web/library/enginfo/cueddatabooks/materials.pdf.*

(Continued)

*Primary Examiner* — Kent W Chang
*Assistant Examiner* — Nathaniel P Brittingham
(74) *Attorney, Agent, or Firm* — Lee & Morse, P.C.

(57) ABSTRACT

A display apparatus may include a substrate, a pad unit on the substrate, a display panel on the substrate, an encapsulation layer covering the display panel, and a protective layer on the pad unit. The protective layer may have an elastic coefficient ranging from about 10 MPa to about 200 GPa.

16 Claims, 4 Drawing Sheets

(56) References Cited

U.S. PATENT DOCUMENTS

| | | | |
|---|---|---|---|
| 2005/0054129 A1* | 3/2005 | Chen | G02F 1/133345 438/30 |
| 2007/0076393 A1* | 4/2007 | Jeong | H05K 1/111 361/767 |
| 2008/0062373 A1* | 3/2008 | Kim | G02F 1/1345 349/151 |
| 2009/0051274 A1 | 2/2009 | Hayashi | |
| 2009/0134530 A1 | 5/2009 | Kurihara et al. | |
| 2010/0113689 A1 | 5/2010 | Naiki et al. | |
| 2010/0164369 A1 | 7/2010 | Yeh et al. | |
| 2011/0090670 A1 | 4/2011 | Ahn et al. | |
| 2011/0186775 A1* | 8/2011 | Shah | C08L 25/02 252/182.32 |
| 2012/0139821 A1 | 6/2012 | Kim et al. | |
| 2014/0217373 A1* | 8/2014 | Youn | H01L 23/4985 257/40 |

FOREIGN PATENT DOCUMENTS

| | | | |
|---|---|---|---|
| CN | 101151292 A | 3/2008 | |
| CN | 101373786 A | 2/2009 | |
| CN | 101932960 A | 12/2010 | |
| JP | WO 2009099049 A1 * | 8/2009 | G02B 5/3033 |
| KR | 10-2006-0104793 A | 10/2006 | |
| KR | 10-2009-0052814 A | 5/2009 | |
| KR | 10-2011-0042566 A | 4/2011 | |
| KR | 10-2011-0048319 A | 5/2011 | |
| KR | 10-2012-0061486 A | 6/2012 | |
| TW | 201025695 A | 7/2010 | |

OTHER PUBLICATIONS

Granta, CES 2009 Edupack Material and Process Charts, 2009, Granta Material Inspiration, pp. 4-7, Charts 1-3, and 12. http://www.grantadesign.com/download/pdf/teaching_resource_books/2-Materials-Charts-2009.pdf.*

DuPont Teflon films, DuPont PFA Properties Bulletin, http://www2.dupont.com/Teflon_Industrial/en_US/assets/downloads/h04321.pdf.*

Topas Advanced Polymers, Cyclic Olefin Copolymer (COC), https://topas.com/sites/default/files/files/TOPAS_Brochure_E_2014_06(1).pdf.*

Liquid Crystal Polymer Material Properties, https://makeitfrom.com/material-properties/Liquid-Crystal-Polymer-LCP.*

Polybutylene Terephthalate (PBT) Material Properties, https://makeitfrom.com/material-properties/Polybutylene-Terephthalate-PBT.*

Polyphenylene Ether (PPE) Material Properties, https://makeitfrom.com/material-properties/Polyphenylene-ether-PPE.*

Fluorinated Ethylene Propylene (FEP) Material Properties, https://makeitfrom.com/material-properties/fluorinated-ethylene-propylene-FEP.*

Chai et al., Mechanical Properties of Carbon nanotube-copper nanocomposites, Jan. 24, 2008, Journal of Micromechanics and Microengineering, IOP Publishing, 18, pp. 1-4. (Year: 2008).*

Taiwanese Office Action dated Nov. 14, 2017.

Taiwanese Office Action issued by the Taiwanese Patent Office dated Jun. 27, 2018 in the examination of the Taiwan Patent Application No. 103130550.

* cited by examiner

DISPLAY APPARATUS HAVING PROTECTIVE LAYER ON THE PAD UNIT AND METHOD OF FABRICATING THE SAME

CROSS-REFERENCE TO RELATED APPLICATION

Korean Patent Application No. 10-2013-0110618, filed on Sep. 13, 2013, in the Korean Intellectual Property Office, and entitled: "Display Apparatus and Method Of Fabricating The Same," is incorporated by reference herein in its entirety.

BACKGROUND

1. Field

Embodiments relate to a display apparatus and a method of fabricating the same.

2. Description of the Related Art

Performance of flat panel display apparatuses has been improved by providing an increased viewing size and a decreased weight. Increased performance has been made possible by advances in semiconductor technologies. Flat panel display apparatuses include liquid crystal displays (LCDs), plasma display devices (PDPs), field emission display devices (FEDs), electroluminescence display devices (ELDs), electrophoresis display devices (EPDs), and organic light-emitting display devices (OLEDs). Because these flat panel display devices are lightweight and slim and allow for a larger view size compared to cathode ray tube (CRT) displays, demand for these newer flat panel display apparatuses has grown dramatically. Flexible display apparatus have also greatly increased in use. Such apparatuses may use a substrate including a flexible material and thus may maintain the display performance even when, for example, bent like paper. A flat panel display apparatus may include an encapsulation layer for encapsulating a display device such that external oxygen or moisture does not intrude into the device. Such encapsulation structures may be applied to flexible, rollable, and foldable display devices.

SUMMARY

Embodiments are directed to a display apparatus including a substrate, a pad unit on the substrate, a display panel on the substrate, an encapsulation layer covering the display panel, and a protective layer on the pad unit. The protective layer has an elastic coefficient ranging from about 10 MPa to about 200 GPa. The pad unit may include a pad electrode on the substrate, and a flexible printed circuit board on the pad electrode, the flexible printed circuit board being electrically connected to the pad electrode.

The protective layer may be on the pad unit, the protective layer covering the pad electrode and a region of the flexible printed circuit board. The protective layer may include an organic material, an inorganic material, or a metal material. The organic material may include, for example, a cyclic olefin copolymer (COC), a poly(methyl methacrylate) (PMMA), a polycarbonate (PC), a cyclo olefin polymer (COP), a liquid crystal polymer (LCP), a polydimethyl siloxane (PDMS), a polyamide (PA), a polyethylene (PE), a polyimide (PI), a polypropylene (PP), a polyphenylene ether (PPE), a polystyrene (PS), a polyoxymethylene (POM), a polyetheretherketone (PEEK), a polyethylene terephthalate (PET), a polytetrafluoroethylene (PTFE), a polyvinylchloride (PVC), a polyvinylidene fluoride (PVDF), a polybutylene terephthalate (PBT), a fluorinated ethylene propylene (FEP), a tetrafluoroethylene (PFA), or a mixture thereof.

The inorganic material may be a carbon film, silicon carbide, or an oxide-based material. The metal material may be tungsten or tungsten carbide.

The protective layer may include an organic layer including an organic material, a metal layer on the organic layer, and an inorganic layer on the metal layer. The protective layer may include at least one organic layer, at least one metal layer and at least one inorganic layer that are alternately stacked. The protective layer may include an organic layer, and a first pattern on the organic layer, wherein the first pattern may include, for example, a cyclic olefin copolymer (COC), a poly(methyl methacrylate) (PMMA), a polycarbonate (PC), a cyclo olefin polymer (COP), a liquid crystal polymer (LCP), a polydimethyl siloxane (PDMS), a polyamide (PA), a polyethylene (PE), a polyimide (PI), a polypropylene (PP), a polyphenylene ether (PPE), a polystyrene (PS), a polyoxymethylene (POM), a polyetheretherketone (PEEK), a polyethylene terephthalate (PET), a polytetrafluoroethylene (PTFE), a polyvinylchloride (PVC), a polyvinylidene fluoride (PVDF), a polybutylene terephthalate (PBT), a fluorinated ethylene propylene (FEP), a tetrafluoroethylene (PFA), or a mixture thereof.

The first pattern may have an elastic coefficient less than an elastic coefficient of the organic layer. The first pattern may have a trapezoidal or triangular shape in section.

The display apparatus may further include a planarization layer on the organic layer, the planarization layer covering the first pattern. The planarization layer may include a liquid phase resin, the liquid phase resin having an elastic coefficient less than an elastic coefficient of the first pattern. The display apparatus may further include a second pattern on the protective layer, wherein the second pattern may include, for example, a cyclic olefin copolymer (COC), a poly (methyl methacrylate) (PMMA), polycarbonate (PC), a cyclo olefin polymer (COP), a liquid crystal polymer (LCP), a polydimethyl siloxane (PDMS), a polyamide (PA), a polyethylene (PE), a polyimide (PI), a polypropylene (PP), a polyphenylene ether (PPE), a polystyrene (PS), a polyoxymethylene (POM), a polyetheretherketone (PEEK), a polyethylene terephthalate (PET), a polytetrafluoroethylene (PTFE), a polyvinylchloride (PVC), a polyvinylidene fluoride (PVDF), a polybutylene terephthalate (PBT), a fluorinated ethylene propylene (FEP), a tetrafluoroethylene (PFA), or a mixture thereof. The display panel may include a plurality of organic light-emitting display devices (OLEDs) spaced apart from each other.

A method of fabricating a display device may include the following. A display panel may be formed on a display region of a substrate and an encapsulation layer covering the display panel. A protective layer may be formed covering a pad electrode of a pad unit on the substrate. The protective layer may have an elastic coefficient ranging from about 10 MPa to about 200 GPa.

Forming the protective layer may include using an adhesive on the pad electrode.

Forming the protective layer may include using a liquid phase resin on the pad electrode.

The encapsulation layer may include an organic material, an inorganic material, or a metal material.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments are described with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration. When a layer or element is referred to as being "on" another layer or substrate, it can be directly on the other layer or substrate, or intervening layers may also be present. When a layer is referred to as being "under" another layer, it can be directly under, and one or more intervening layers may also be present. When a layer is referred to as being "between" two layers, it can be the only layer between the two layers, or one or more intervening layers may also be present. Sizes of elements in the drawings may be exaggerated for clarity and convenience of explanation. Like reference numerals refer to like elements throughout. Expressions such as "at least one of," when preceding a list of elements, modify the entire list of elements and do not modify the individual elements of the list.

The terms of a singular form may include plural forms unless otherwise specified. The meaning of "include," "comprise," "including," or "comprising," specifies a property, a region, a fixed number, a step, a process, an element and/or a component but does not exclude other properties, regions, fixed numbers, steps, processes, elements and/or components. Relational terms such as "first," "second," and the like may be used for describing various elements, but the elements should not be limited by the terms. These terms are only used to distinguish one element from another. When a certain embodiment may be implemented differently, a specific process order may be performed differently from the described order. For example, two consecutively described processes may be performed substantially at the same time or performed in an order opposite to the described order.

Figure 1:
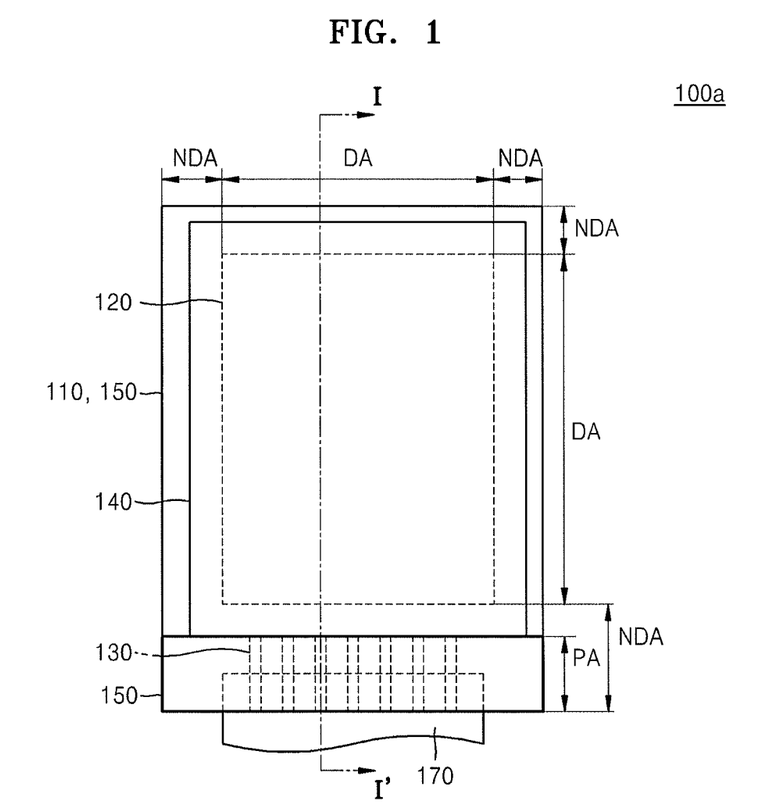
FIG. 1 illustrates a plan view of a structure of a display apparatus.
Figure 2:
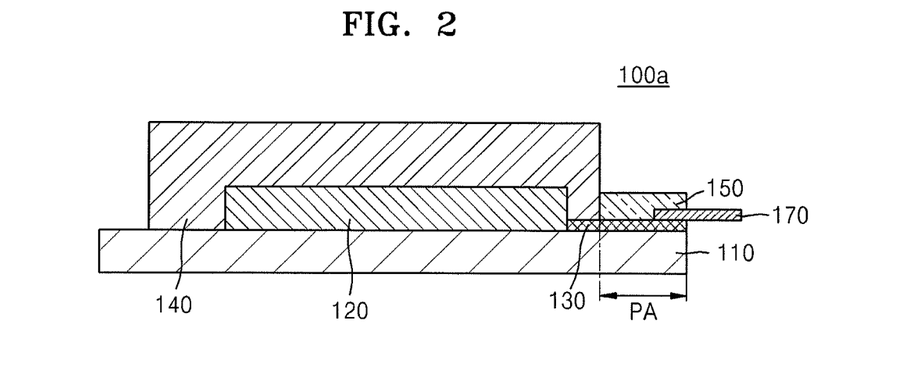
FIG. 2 illustrates a cross-sectional view taken along line I-I' of FIG. 1.

FIG. 1 illustrates a plan view of a structure of a display apparatus 100a, and FIG. 2 is a cross-sectional view of the display apparatus 100a taken along line I-I' of FIG. 1. Referring to FIGS. 1 and 2 together, the display apparatus 100a may include a substrate 110, a display panel 120, a pad electrode 130, an encapsulation layer 140, and a protective layer 150. The substrate 110 may include, for example, a transparent glass material containing $SiO_2$ as a main component. Substrates include, for example, various suitable materials such as a ceramic material, a plastic material, or a metal. The substrate 110 may be a flexible substrate. The substrate 110 may be, for example, a fiber reinforced plastic (FRP) substrate. The substrate 110 may include, for example, fibrous tissue or/and polymer resin. The fibrous tissue may be an optical fiber, or a cotton yarn or fabric using an optical fiber. The polymer resin may include an epoxy resin, an acrylic resin, or the like.

The display panel 120 may be on the substrate 110, enabling implementation of a panel displaying letters, figures, or images, and may include a driving device for driving a plurality of display devices and/or itself. The display device may be a liquid crystal display (LCD), an organic light-emitting display device (OLED), a plasma display device (PDP), or an electrophoresis display device (EPD). The display device may include, for example, signal lines, such as a gate line transmitting a gate signal, and a data line transmitting a data signal, a switching device connected to the gate line and the data line, and a pixel electrode connected to the switching device to receive the data signal. Each of the display devices may form a unit pixel.

A region where the display panel 120 is formed may be a display region DA of the display apparatus 100a. In the display apparatus 100a, a region other than the display region DA may be a non-display region NDA. In the NDA outside the display panel 120, a pad unit PA including a plurality of pad electrodes 130 may be formed. The plurality of pad electrodes 130 may be electrically connected to the display panel 120. The display apparatus 100a may be connected to a driving circuit and a power supply to receive a driving signal and power. The power and the driving signals may be applied to the display apparatus 100a through the pad electrodes 130 of the pad unit PA. The pad electrodes 130 may be electrically connected to corresponding wirings in the display panel 120.

The driving circuits may be on a flexible printed circuit board 170, which may be electrically connected to the display apparatus 100a through the pad unit PA, or may be mounted in the form of an integrated circuit (IC) chip on a region other than the display region DA of the display apparatus 100a. The flexible printed circuit board 170 may be formed on the pad electrodes 130 after the encapsulation layer 140 covering the display panel 120 and before a protective layer 150 is formed on the pad unit PA.

Signal lines such as scanning lines and/or data lines of the display panel 120 may be respectively connected to the corresponding pad electrodes 130 to receive scanning signals and data signals supplied from the driving circuit. A power line of the display panel 120 may be connected to the corresponding pad electrodes 130 to receive power supplied from the power supply. In order to electrically connect the display panel 120 to the pad electrodes 130, a connecting wiring may extend from the display panel 120 to form the pad electrodes 130. A connecting wiring may be, for example between the display panel 120 and the pad electrodes 130.

The encapsulation layer 140 may be provided to prevent intrusion of external air, such as external moisture or oxygen into the display panel, and may surround an upper surface and side surfaces. The encapsulation layer 140 may include a plurality of inorganic layers, or an inorganic layer and an organic layer. The organic layer of the encapsulation layer 140 may include, for example, a polymer, and may be a single layer or a layer stack including, for example, polyethylene terephthalate, polyimide, polycarbonate, epoxy, polyethylene, polyacrylate, or the like. The organic layer may include, for example, polyacrylate, and, for example, may include a polymerized monomer composition including diacrylate-based monomer and triacrylate-based monomer. The monomer composition may further include a monoacrylate-based monomer. The monomer composition may further include, for example, a suitable photoinitiator such as trimethyl benzoyl diphenyl phosphine oxide (TPO).

The inorganic layer of the encapsulation layer 140 may be a single layer or a layer stack including a metal oxide or a metal nitride. In detail, the inorganic layer may include any one of $SiN_x$, $Al_2O_3$, $SiO_2$, and $TiO_2$. The top layer of the encapsulation layer 140 that is exposed to the outside may include, for example, an inorganic layer in order to prevent intrusion of moisture into the organic light-emitting device. The encapsulation layer 140 may include at least one sandwich structure in which at least one organic layer is between at least two inorganic layers. The encapsulation layer 140 may include, for example, at least one sandwich structure in which at least one inorganic layer is between at least two organic layers. The encapsulation layer 140 may include a sandwich structure in which at least one organic layer is between at least two inorganic layers and a sandwich structure in which at least one inorganic layer is between at least two organic layers.

The encapsulation layer 140 may include a first inorganic layer, a first organic layer, and a second inorganic layer sequentially formed from the top portion of the display panel 120. The encapsulation layer 140 may include a first inorganic layer, a first organic layer, a second inorganic layer, a second organic layer, and a third inorganic layer sequentially formed from the top portion of the display panel 120. The encapsulation layer 140 may include a first inorganic layer, a first organic layer, a second inorganic layer, a second organic layer, a third inorganic layer, a third organic layer, and a fourth inorganic layer sequentially formed from the top portion of the display panel 120. A halogenized metal layer including lithium fluoride (LiF) may be additionally included between the display panel 120 and the first inorganic layer. The halogenized metal layer may prevent the display panel 120 from being damaged, when, for example, the first inorganic layer is formed by a sputtering method or a plasma deposition method.

The first organic layer may be smaller than the second inorganic layer, and the second organic layer may be smaller than the third inorganic layer. The first organic layer may be completely or partially covered by the second inorganic layer, and the second organic layer may be completely or partially covered by the third inorganic layer.

A protective layer 150 may be formed on the pad unit PA in order to cover the pad electrodes 130. The protective layer 150 may be formed on the pad unit PA after the encapsulation layer 140 covering the display panel 120 is formed. The protective layer 150 may have an elastic coefficient, for example, ranging from about 10 MPa to about 200 GPa, and may be on the substrate 110 of the pad unit PA by using an adhesive layer. The protective layer 150 may be formed by using an organic material, an inorganic material, or a metal material. The protective layer 150 may have a thickness, for example, ranging from about 10 μm to about 150 μm.

The organic material may include, for example, a cyclic olefin copolymer (COC), a poly(methyl methacrylate) (PMMA), a polycarbonate (PC), a cyclo olefin polymer (COP), a liquid crystal polymer (LCP), a polydimethyl siloxane (PDMS), polyamide (PA), a polyethylene (PE), a polyimide (PI), a polypropylene (PP), polyphenylene ether (PPE), a polystyrene (PS), a polyoxymethylene (POM), polyetheretherketone (PEEK), a polyethylene terephthalate (PET), a polytetrafluoroethylene (PTFE), a polyvinylchloride (PVC), a polyvinylidene fluoride (PVDF), a polybutylene terephthalate (PBT), a fluorinated ethylene propylene (FEP), a tetrafluoroethylene (PFA), or any mixture thereof, for example, of which the elastic coefficient satisfies a range described herein. Any suitable organic material may be used, for example, if the elastic coefficient thereof satisfies such a range.

The inorganic material may be, for example, a carbon film, silicon carbide, or an oxide-based material of which the elastic coefficient satisfies, for example, a range described herein. Any suitable inorganic material may be used, for example, if the elastic coefficient thereof satisfies such a range. The metal material may be, for example, tungsten or tungsten carbide of which the elastic coefficient, for example, satisfies a range described herein. Any suitable metal material may be used if the elastic coefficient thereof, for example, satisfies such a range. The protective layer 150 may be formed by using glass fiber-reinforced polyester, a glass powder, or glass fiber of which the elastic coefficient satisfies a range described herein. The adhesive layer on the substrate 110 of the pad unit PA may have a thickness of, for example, from about 10 μm to about 150 μm. The adhesive layer may include at least one resin selected from an acryl-based resin, a urethane-based resin, a silicon-based resin, and an epoxy-based resin.

The protective layer 150 may be formed by using a method of coating a resin on the pad electrodes 130. The resin may include, for example, an acryl-based resin, a urethane-based resin, a silicon-based resin, or an epoxy-based resin. The resin may further include additives, such as a UV hardener or a thermal hardener, and may further include nanoparticles, such as nano-scaled Al or $SiO_2$. Because the protective layer 150 is on the pad electrode 130, a high stress applied to the pad unit PA when, for example, the display apparatus 100a is bent may be alleviated. Even when, for example, the display apparatus 100a is bent, occurrence of failure such as cracks in the pad electrodes 130 may be prevented, so that the reliability of the display apparatus 100a may be enhanced.

Figure 3:
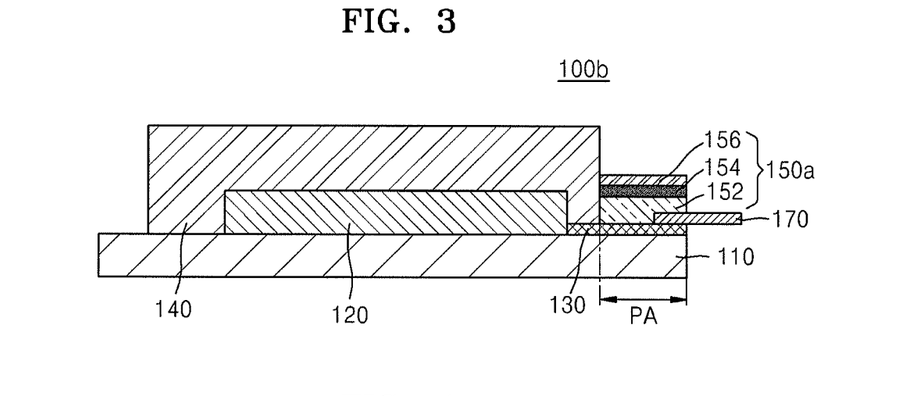
FIGS. 3 to 8 schematically illustrates cross-sectional views taken along line I-I' of FIG. 1 for sections of display apparatuses.

FIGS. 3 to 8 schematically illustrate cross-sectional views taken along line I-I' of FIG. 1 for sections of the display apparatus 100a according to various embodiments referred to as display apparatuses 100b to 100g. In FIG. 3, the same reference numerals as those in FIG. 2 refer to the same members. Referring to FIG. 3, a protective layer 150a on a pad electrode 130 in a pad unit PA of display apparatus 100b may include an organic layer 152, a metal layer 154, and an inorganic layer 156 sequentially stacked.

The organic layer 152 may have, for example, an elastic coefficient, for example, ranging from about 10 MPa to about 200 GPa, and may include a cyclic olefin copolymer (COC), a poly(methyl methacrylate) (PMMA), a polycarbonate (PC), a cyclo olefin polymer (COP), a liquid crystal polymer (LCP), a polydimethyl siloxane (PDMS), a polyamide (PA), a polyethylene (PE), a polyimide (PI), a polypropylene (PP), a polyphenylene ether (PPE), a polystyrene (PS), a polyoxymethylene (POM), a polyetheretherketone (PEEK), a polyethylene terephthalate (PET), a polytetrafluoroethylene (PTFE), a polyvinylchloride (PVC), a polyvinylidene fluoride (PVDF), a polybutylene terephthalate (PBT), a fluorinated ethylene propylene (FEP), a tetrafluoroethylene (PFA), or any mixture thereof. Any suitable organic material may be used if the elastic coefficient thereof, for example, satisfies a range described herein. The metal layer 154 may include, for example, a material including Pt, Au, Ag, Ta, Ti, Cr, Al, Cu, carbon nanotube (CNT), graphene, silver nanowire, a polymer conductor, or a combination thereof. The inorganic layer 156 may include, for example, SiNx, $Al_2O_3$, $SiO_2$, $TiO_2$, SiON, AZO, ZnO, ZrO, or a combination thereof. While an embodiment may show and describe the protective layer 150a including the metal layer 154 and the inorganic layer 156 sequentially arranged on the organic layer 152, other arrangements may be used, for example, the inorganic layer 156 and the metal layer 154 may be sequentially on the organic layer 152.

Figure 4:
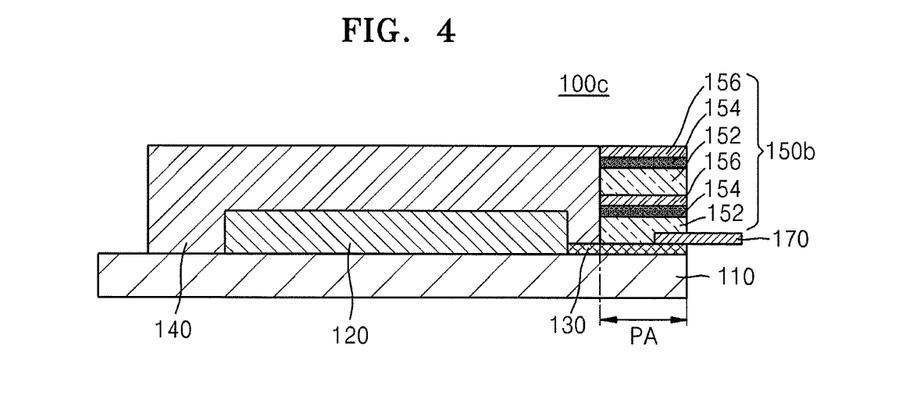

FIG. 4 schematically illustrates a cross-sectional view taken along line I-I' of FIG. 1 of a section of the display apparatus 100a according to an embodiment referred to as a display apparatus 100c. In FIG. 4, the same reference numerals as those in FIG. 3 refer to the same members. Referring to FIG. 4, a protective layer 150b on a pad electrode 130 in a pad unit PA of the display apparatus 100c may include an organic layer 152, a metal layer 154, and an inorganic layer 156 alternately formed. FIG. 4 illustrates that a protective layer 150a including the organic layer 152, the metal layer 154 and the inorganic layer 156 may be stacked, for example, in two layers to form a single protective layer 150b. In other implementations, for example, the protective layer 150a may be stacked in three or more layers to form a single protective layer 150b.

Figure 5:
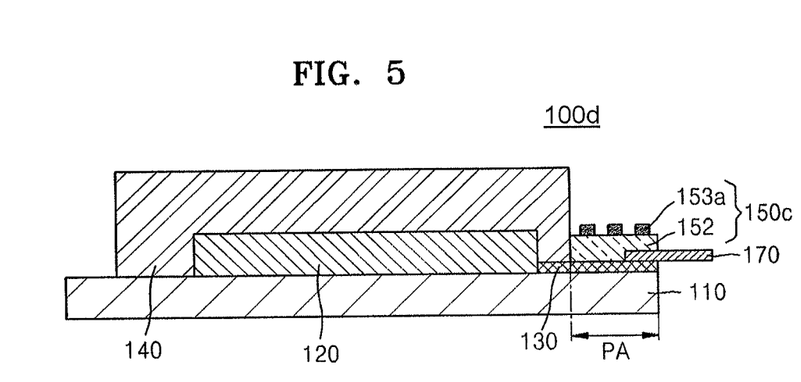

FIG. 5 schematically illustrates a cross-sectional view taken along line I-I' of FIG. 1 of a section of the display apparatus 100a according to an embodiment referred to as display apparatus 100d. In FIG. 5, the same reference numerals as those in FIG. 2 refer to the same members. Referring to FIG. 5, a protective layer 150c on a pad electrode 130 in a pad unit PA of the display apparatus 100d may include an organic layer 152, and a first pattern 153a on the organic layer 152. The first pattern 153a may have, for example, a rectangular shape in section. In other implementations, other shaped sections may be employed.

The first pattern 153a may include, for example, a cyclic olefin copolymer (COC), a poly(methyl methacrylate) (PMMA), a polycarbonate (PC), a cyclo olefin polymer (COP), a liquid crystal polymer (LCP), a polydimethyl siloxane (PDMS), polyamide (PA), a polyethylene (PE), a polyimide (PI), a polypropylene (PP), polyphenylene ether (PPE), a polystyrene (PS), a polyoxymethylene (POM), polyetheretherketone (PEEK), a polyethylene terephthalate (PET), a polytetrafluoroethylene (PTFE), a polyvinylchloride (PVC), a polyvinylidene fluoride (PVDF), a polybutylene terephthalate (PBT), a fluorinated ethylene propylene (FEP), a tetrafluoroethylene (PFA), or a mixtures thereof. The first pattern 153a may include, for example, a material having an elastic coefficient less than an elastic coefficient of the organic layer 152, and may have an elastic coefficient ranging, for example, from about 10 MPa to about 10 GPa.

Figure 6:
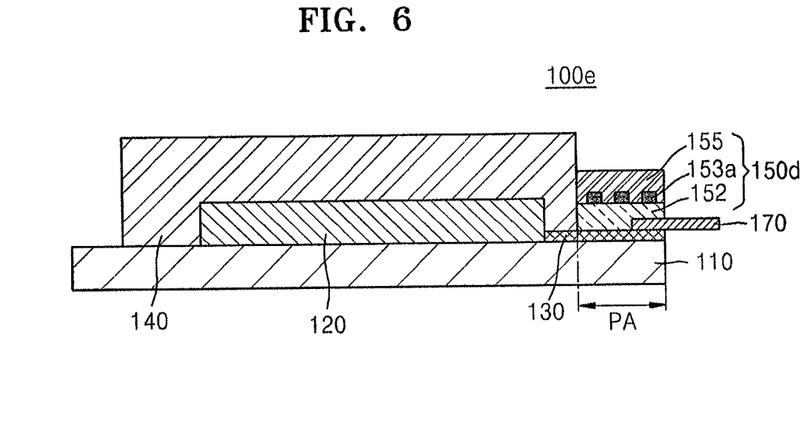

FIG. 6 schematically illustrates a cross-sectional view taken along line I-I' of FIG. 1 of a section of the display apparatus 100a according to an embodiment referred to as display apparatus 100e. In FIG. 6, the same reference numerals as those in FIG. 5 refer to the same members. Referring to FIG. 6, a protective layer 150d on a pad electrode 130 in a pad unit PA of the display apparatus 100e may include an organic layer 152, a first pattern 153a on the organic layer 152, and a planarization layer 155 on the organic layer 152 covering the first pattern 153a. The planarization layer 155 may planarize the first pattern 153a while covering the first pattern 153a, and may be formed by using a liquid phase resin. The resin may have an elastic coefficient less than an elastic coefficient of the first pattern 153a.

Figure 7:
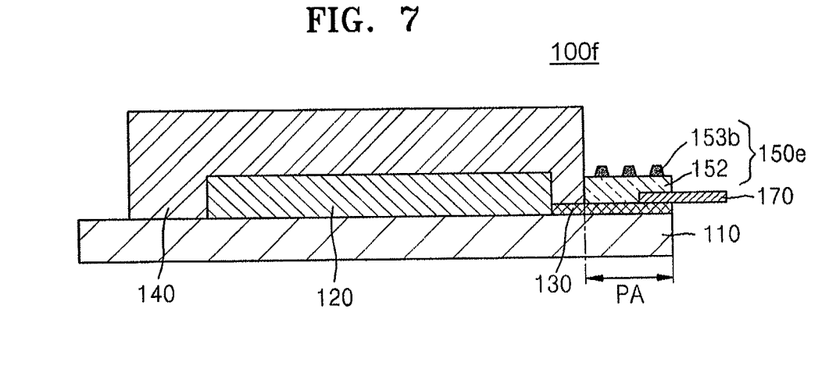

FIG. 7 schematically illustrates a cross-sectional view taken along line I-I' of FIG. 1 of a section of the display apparatus 100a according to an embodiment referred to as display apparatus 100f. In FIG. 7, the same reference numerals as those in FIG. 5 refer to the same members. Referring to FIG. 7, a protective layer 150e on a pad electrode 130 of a pad unit PA of the display apparatus 100f may include an organic layer 152, and a first pattern 153b on the organic layer 152. The first pattern 153b may include, for example, an olefin copolymer (COC), a poly(methyl methacrylate) (PMMA), a polycarbonate (PC), a cyclo olefin polymer (COP), a liquid crystal polymer (LCP), a polydimethyl siloxane (PDMS), a polyamide (PA), a polyethylene (PE), a polyimide (PI), a polypropylene (PP), a polyphenylene ether (PPE), a polystyrene (PS), a polyoxymethylene (POM), a polyetheretherketone (PEEK), a polyethylene terephthalate (PET), a polytetrafluoroethylene (PTFE), a polyvinylchloride (PVC), a polyvinylidene fluoride (PVDF), a polybutylene terephthalate (PBT), a fluorinated ethylene propylene (FEP), a tetrafluoroethylene (PFA), or a mixture thereof. The first pattern 153b may include, for example, a material having an elastic coefficient, for example, less than an elastic coefficient of the organic layer 152, and may have an elastic coefficient, for example, ranging from about 10 MPa to about 10 GPa. While FIG. 7 illustrates the first pattern 153b having a trapezoidal shape in section, in other embodiments, other shapes for the section of the first pattern 153b may be used.

Figure 8:
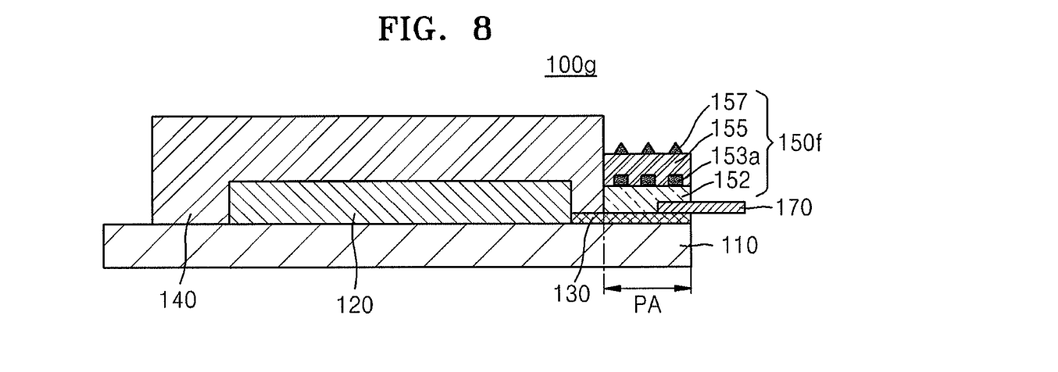

FIG. 8 schematically illustrates a cross-sectional view taken along line I-I' of FIG. 1 of a section of the display apparatus 100a according to an embodiment referred to as display apparatus 100g. In FIG. 8, the same reference numerals as those in FIG. 6 refer to the same members. Referring to FIG. 8, a protective layer 150f on a pad electrode 130 of a pad unit PA of the display apparatus 100g may include an organic layer 152, a first pattern 153a on the organic layer 152, a planarization layer 155 on the organic layer 152 covering the first pattern 153a, and a second pattern 157 on the planarization layer 155. The second pattern 157 may include, for example, a cyclic olefin copolymer (COC), a poly(methyl methacrylate) (PMMA), a polycarbonate (PC), a cyclo olefin polymer (COP), a liquid crystal polymer (LCP), a polydimethyl siloxane (PDMS), a polyamide (PA), a polyethylene (PE), a polyimide (PI), a polypropylene (PP), a polyphenylene ether (PPE), a polystyrene (PS), a polyoxymethylene (POM), a polyetheretherketone (PEEK), a polyethylene terephthalate (PET), polytetrafluoroethylene (PTFE), a polyvinylchloride (PVC), a polyvinylidene fluoride (PVDF), a polybutylene terephthalate (PBT), a fluorinated ethylene propylene (FEP), a tetrafluoroethylene (PFA), or a mixture thereof. The second pattern 157 may include for example, a material having an elastic coefficient, for example, less than an elastic coefficient of the organic layer 152, and may have an elastic coefficient ranging, for example, from about 10 MPa to about 10 GPa. While FIG. 8 may show the second pattern 157 having a triangular shape in section, in other implementations, the second pattern 157 may have various other shapes in section.

Figure 9:
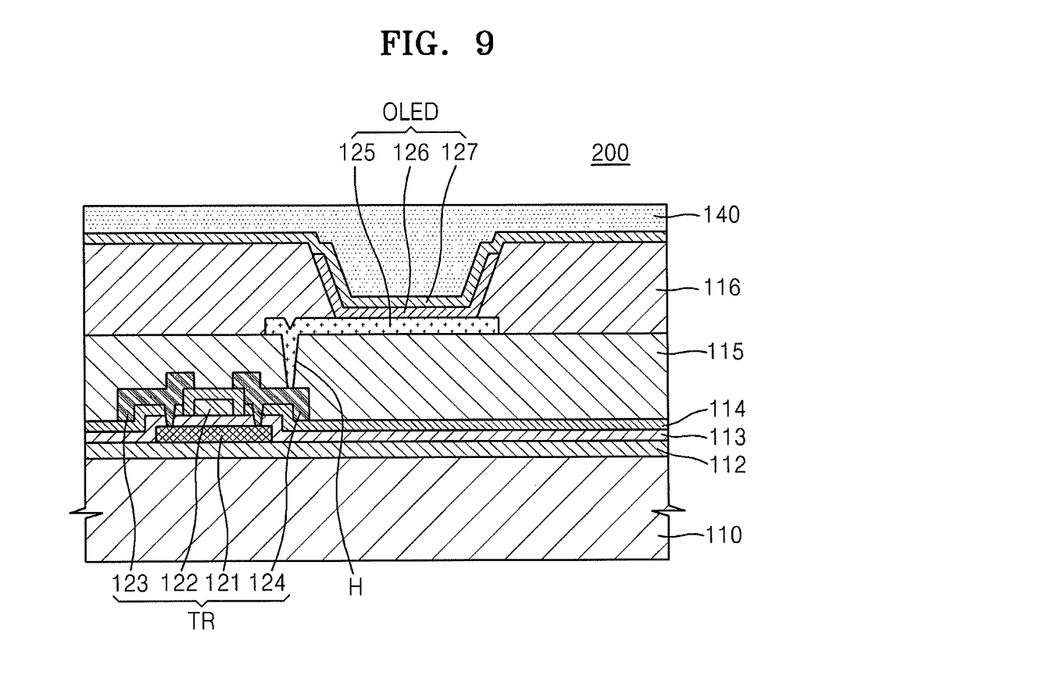
FIG. 9 schematically illustrates a cross-sectional view of an embodiment of a display panel.

FIG. 9 schematically illustrates a cross-sectional view of a display panel. The display panel 200 may include, for example, a plurality of OLEDs spaced apart from each other, and thin film transistors (TRs). The OLEDs and the TRs may be on a substrate 110. The substrate 110 may include, for example, a glass material, a plastic material, or a metal material. A buffer layer 112 may be on the substrate 110. The buffer layer 112 may include an insulator in order to provide a planarizing surface to a top surface of the substrate 110 and prevent intrusion of moisture or foreign particles toward the substrate 110.

A thin film transistor (TR), a capacitor, and an organic light emitting device (OLED) may be on the buffer layer 112. The thin film transistor TR may include an active layer 121, a gate electrode 122, a source electrode 123, and a drain electrode 124. The OLED may include a first electrode 125, a second electrode 127, and an intermediate layer 126. In detail, the active layer 121 may be disposed in a predetermined pattern on the buffer layer 112. The active layer 121 may contain an inorganic material, such as silicon, an organic material, or an oxide semiconductor material, or may be formed by implanting p-type or n-type dopants. A gate insulating layer 113 may be on the active layer 121. The gate electrode 122 may be on the gate insulating layer 113 corresponding to the active layer 121. An interlayer insulating layer 114 covering the gate electrode 122 may be formed, and the source electrode 123 and the drain electrode 124 may be on the interlayer insulating layer 114 contacting predetermined regions of the active layer 121.

The planarization layer 115 covering the source electrode 123 and the drain electrode 124 may be formed, and an additional insulating layer may be further formed on the planarization layer 115. The first electrode 125 may be on the planarization layer 115. The first electrode 125 may be formed such that it is electrically connected to any one of the source electrode 123 and the drain electrode 124 through a through hole (h). A pixel definition layer 116 may cover the first electrode 125. After a predetermined opening is formed in the pixel definition layer 116, the intermediate layer 126 having an organic emission layer may be formed within a region defined by the opening. The pixel definition layer 116 may define a pixel region and a non-pixel region. That is, the opening of the pixel definition layer 116 may become a substantial pixel region.

The second electrode 127 may be on the intermediate layer 126. The first electrode 125 may be patterned per pixel, and the second electrode 127 may be formed such that a common voltage may be applied to all the pixels. While only one OLED is illustrated in the drawing, the display apparatus 10 may include a plurality of OLEDs. Each of the OLEDs may form, for example, one pixel, and each pixel may display red, green, blue or white color. Other numbers of pixels and/or colors may be employed.

The intermediate layer 126 may be provided commonly on the entire surface of the planarization layer 115 regardless of the position of the pixel. The organic emission layer may be formed as a structure in which layers including a light-emitting substance emitting a red light, a light-emitting substance emitting a green light, and a light-emitting substance emitting a blue light are stacked vertically on or mixed with one another. Any combination of various colors, which is capable of emitting a white light, may be employed in addition or in the alternative to a combination of red, green, and blue colors. The pixels may include a color converting layer or a color filter that coverts the white light into a light of a predetermined color. The encapsulation layer 140 may be on the OLED, and the pixel definition layer 116 may cover and protect the OLED.

By way of summation and review, according to the one or more of the embodiment described herein, a protective layer may be on a pad unit to enhance reliability of a display apparatus, for example, display apparatuses 100a, 100b, 100c, 100d, 100e, 100f, and 100g.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, various changes in form and details may be made without departing from the spirit and scope of the present disclosure as set forth in the following claims.

What is claimed is:

1. A display apparatus, comprising:
a substrate;
a pad unit on the substrate, the pad unit including:
a pad electrode on the substrate; and
a flexible printed circuit board on the pad electrode, the flexible printed circuit board being electrically connected to the pad electrode;
a display panel on the substrate;
an encapsulation layer covering the display panel and a portion of the pad electrode; and
a protective layer on the pad unit, the protective layer covering a region of the pad electrode and at least a portion of a region of the flexible printed circuit board, the protective layer having an elastic coefficient ranging from 10 MPa to 200 GPa, the protective layer including:
an organic layer on the pad unit, and
a first pattern on the organic layer, the organic layer being interposed between the pad unit and the first pattern,
wherein:
the organic layer includes an organic material that includes at least one of a cyclic olefin copolymer (COC), a poly(methyl methacrylate) (PMMA), a polycarbonate (PC), a cyclo olefin polymer (COP), a liquid crystal polymer (LCP), a polydimethyl siloxane (PDMS), a polyamide (PA), a polyethylene (PE), a polyimide (PI), a polypropylene (PP), a polyphenylene ether (PPE), a polystyrene (PS), polyoxymethylene (POM), a polyetheretherketone (PEEK), a polyethylene terephthalate (PET), a polytetrafluoroethylene (PTFE), a polyvinylchloride (PVC), a polyvinylidene fluoride (PVDF), a polybutylene terephthalate (PBT), a fluorinated ethylene propylene (FEP), or a tetrafluoroethylene (PFA), and
the first pattern includes an organic material having an elastic coefficient less than the elastic coefficient of the organic material of the organic layer.

2. The display apparatus as claimed in claim 1, wherein the protective layer further includes an inorganic material or a metal material.

3. The display apparatus as claimed in claim 2, wherein the inorganic material is a carbon film, silicon carbide, or an oxide-based material.

4. The display apparatus as claimed in claim 2, wherein the metal material is tungsten or tungsten carbide.

5. The display apparatus as claimed in claim 1, wherein the protective layer includes an organic layer including an organic material, a metal layer on the organic layer, and an inorganic layer on the metal layer.

6. The display apparatus as claimed in claim 1, wherein the protective layer includes at least one organic layer, at least one metal layer, and at least one inorganic layer that are alternately stacked.

7. The display apparatus as claimed in claim 1, wherein the first pattern includes a cyclic olefin copolymer (COC), a poly(methyl methacrylate) (PMMA), a polycarbonate (PC), a cyclo olefin polymer (COP), a liquid crystal polymer (LCP), a polydimethyl siloxane (PDMS), a polyamide (PA), a polyethylene (PE), a polyimide (PI), a polypropylene (PP), a polyphenylene ether (PPE), a polystyrene (PS), polyoxymethylene (POM), a polyetheretherketone (PEEK), a polyethylene terephthalate (PET), a polytetrafluoroethylene (PTFE), a polyvinylchloride (PVC), a polyvinylidene fluoride (PVDF), a polybutylene terephthalate (PBT), a fluorinated ethylene propylene (FEP), a tetrafluoroethylene (PFA), or a mixture thereof.

8. The display apparatus as claimed in claim 1, wherein the first pattern has a trapezoidal or triangular shape in section.

9. The display apparatus as claimed in claim 1, further comprising a planarization layer on the organic layer, the planarization layer covering the first pattern.

10. The display apparatus as claimed in claim 9, wherein the planarization layer includes a liquid phase resin, the liquid phase resin having an elastic coefficient less than an elastic coefficient of the first pattern.

11. The display apparatus as claimed in claim 9, further comprising a second pattern on the protective layer, wherein the second pattern includes a cyclic olefin copolymer (COC), a poly(methyl methacrylate) (PMMA), a polycarbonate (PC), cyclo olefin polymer (COP), a liquid crystal polymer (LCP), a polydimethyl siloxane (PDMS), a polyamide (PA), a polyethylene (PE), a polyimide (PI), a polypropylene (PP), a polyphenylene ether (PPE), a polystyrene (PS), a polyoxymethylene (POM), a polyetheretherketone (PEEK), a polyethylene terephthalate (PET), a polytetrafluoroethylene (PTFE), a polyvinylchloride (PVC), a polyvinylidene fluoride (PVDF), a polybutylene terephthalate (PBT), a fluorinated ethylene propylene (FEP), a tetrafluoroethylene (PFA), or a mixture thereof.

12. The display apparatus as claimed in claim 1, wherein the display panel includes a plurality of organic light-emitting display devices (OLEDs) spaced apart from each other in a display area of the display panel.

13. A method of fabricating a display device, the method comprising:
    providing a substrate:
    forming a display panel on a display region of the substrate;
    forming a pad unit on the substrate, the pad unit including:
        a pad electrode on the substrate; and
        a flexible printed circuit board on the pad electrode, the flexible printed circuit board being electrically connected to the pad electrode;
    forming an encapsulation layer covering the display panel and part of the pad electrode; and
    forming a protective layer on the pad unit, the protective layer covering a region of the pad electrode and a region of the flexible printed circuit board, wherein the protective layer has an elastic coefficient ranging from about 10 MPa to about 200 GPa, the protective layer including:
    an organic layer on the pad unit, and
    a first pattern on the organic layer, the organic layer being interposed between the pad unit and the first pattern, wherein:
    the organic layer includes an organic material that includes at least one of a cyclic olefin copolymer (COC), a poly(methyl methacrylate) (PMMA), a polycarbonate (PC), a cyclo olefin polymer (COP), a liquid crystal polymer (TCP), a polydimethyl siloxane (PDMS), a polyamide (PA), a polyethylene (PE), a polyimide (PI), a polypropylene (PP), a polyphenylene ether (PPE), a polystyrene (PS), polyoxymethylene (POM), a polyetheretherketone (PEEK), a polyethylene terephthalate (PET), a polytetrafluoroethylene (PTFE), a polyvinylchloride (PVC), a polyvinylidene fluoride (PVDF), a polybutylene terephthalate (PBT), a fluorinated ethylene propylene (FEP), or a tetrafluoroethylene (PFA), and
    the first pattern includes an organic material having an elastic coefficient less than the elastic coefficient of the organic material of the organic layer.

14. The method as claimed in claim 13, wherein forming the protective layer includes using an adhesive on the pad electrode.

15. The method as claimed in claim 13, wherein forming the protective layer includes using a liquid phase resin on the pad electrode.

16. The method as claimed in claim 13, wherein the encapsulation layer includes an organic material, an inorganic material, or a metal material.

\* \* \* \* \*